US012751259B2

(12) United States Patent
Sakamoto et al.

(10) Patent No.: US 12,751,259 B2
(45) Date of Patent: Sep. 29, 2026

(54) EMBEDDING METHOD AND PROCESSING SYSTEM

(71) Applicant: Tokyo Electron Limited, Tokyo (JP)

(72) Inventors: Masato Sakamoto, Nirasaki City (JP); Tadahiro Ishizaka, Nirasaki City (JP); Issei Takeyasu, Nirasaki City (JP); Kohichi Satoh, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 365 days.

(21) Appl. No.: 18/550,177

(22) PCT Filed: Mar. 9, 2022

(86) PCT No.: PCT/JP2022/010228

§ 371 (c)(1),
(2) Date: Sep. 12, 2023

(87) PCT Pub. No.: WO2022/202315

PCT Pub. Date: Sep. 29, 2022

(65) Prior Publication Data

US 2024/0153818 A1 May 9, 2024

(30) Foreign Application Priority Data

Mar. 23, 2021 (JP) ................................ 2021-048240

(51) Int. Cl.

| | |
|---|---|
| ***H10W 20/00*** | (2026.01) |
| ***C23C 16/02*** | (2006.01) |
| ***C23C 16/16*** | (2006.01) |
| ***C23C 16/448*** | (2006.01) |

(Continued)

(52) U.S. Cl.

CPC ....... *H10W 20/056* (2026.01); *C23C 16/0227* (2013.01); *C23C 16/16* (2013.01); *C23C 16/4481* (2013.01); *C23C 16/46* (2013.01); *C23C 16/52* (2013.01)

(58) Field of Classification Search

None

See application file for complete search history.

(56) References Cited

U.S. PATENT DOCUMENTS

2001/0026963 A1* 10/2001 Itatani .................... H10D 1/696 438/149

2003/0124252 A1* 7/2003 Park .................... C23C 16/0281 427/255.28

(Continued)

FOREIGN PATENT DOCUMENTS

JP 2008-022021 A 1/2008

JP 2010-199349 A 9/2010

(Continued)

*Primary Examiner* — Bilkis Jahan

(74) *Attorney, Agent, or Firm* — Armstrong Teasdale LLP

(57) ABSTRACT

An embedding method includes: preparing a substrate including an insulating film formed with a recess and a metal film exposed from a bottom of the recess; embedding a first ruthenium film from the bottom of the recess to a middle of the recess by CVD using a ruthenium-containing gas while heating the substrate to a first temperature; and embedding a second ruthenium film over the first ruthenium film in the recess by CVD using the ruthenium-containing gas while heating the substrate to a second temperature lower than the first temperature.

18 Claims, 9 Drawing Sheets

(51) Int. Cl.
*C23C 16/46* (2006.01)
*C23C 16/52* (2006.01)

(56) References Cited

U.S. PATENT DOCUMENTS

2014/0019716 A1* 1/2014 Jezewski ............. H10W 20/425
438/643
2016/0276218 A1* 9/2016 Matsumoto ......... H10W 20/425
2018/0012844 A1* 1/2018 Ishizaka .............. H10W 20/062
2020/0111675 A1* 4/2020 Takatsuki ................ H10P 14/43
2021/0010135 A1* 1/2021 Ishizaka ............ C23C 16/45536

FOREIGN PATENT DOCUMENTS

JP 2020-043139 A 3/2020
JP 2020-059916 A 4/2020

* cited by examiner

EMBEDDING METHOD AND PROCESSING SYSTEM

CROSS-REFERENCE TO RELATED APPLICATIONS

The present application is a U.S. National Stage Entry of International Patent Application No. PCT/JP2022/010228, filed Mar. 9, 2022, which claims the benefit of priority to Japanese Patent Application No. 2021-048240, filed Mar. 23, 2021, each of which is hereby incorporated herein by reference in its entirety.

TECHNICAL FIELD

The present disclosure relates to an embedding method and a processing system.

BACKGROUND

In a manufacturing process of semiconductor devices, there is a process of embedding metal films into recesses such as trenches or holes. For example, Patent Document 1 discloses embedding a tungsten (W) film into a recess by Chemical Vapor Deposition (CVD), in which a portion of the W film is formed at a first temperature and the remaining portion of the W film is formed at a second temperature higher than the first temperature.

In addition, ruthenium (Ru), which is a low-resistance material, is attracting attention as an embedding metal. Patent Document 2 proposes a method of embedding a Ru film into a recess of a substrate, which has a metal film at a bottom of the recess, such that the Ru film is formed in a bottom-up manner from the metal film at the bottom by CVD.

PRIOR ART DOCUMENTS

Patent Documents

Patent Document 1: Japanese Patent Laid-Open Publication No. 2010-199349

Patent Document 2: Japanese Patent Laid-Open Publication No. 2020-043139

SUMMARY

The present disclosure provides an embedding method and processing system that can embed a ruthenium film into a recess with good embeddability.

An embedding method according to an aspect of the present disclosure includes: preparing a substrate including an insulating film formed with a recess and a metal film exposed from a bottom of the recess; embedding a first ruthenium film from the bottom of the recess to a middle of the recess by CVD using a ruthenium-containing gas while heating the substrate to a first temperature; and embedding a second ruthenium film over the first ruthenium film in the recess by CVD using the ruthenium-containing gas while heating the substrate to a second temperature lower than the first temperature.

According to the present disclosure, it is possible to provide an embedding method and processing system that can embed a ruthenium film into a recess with good embeddability.

DETAILED DESCRIPTION

Hereinafter, embodiments will be described with reference to the accompanying drawings.

<Film Forming System>

Figure 1:
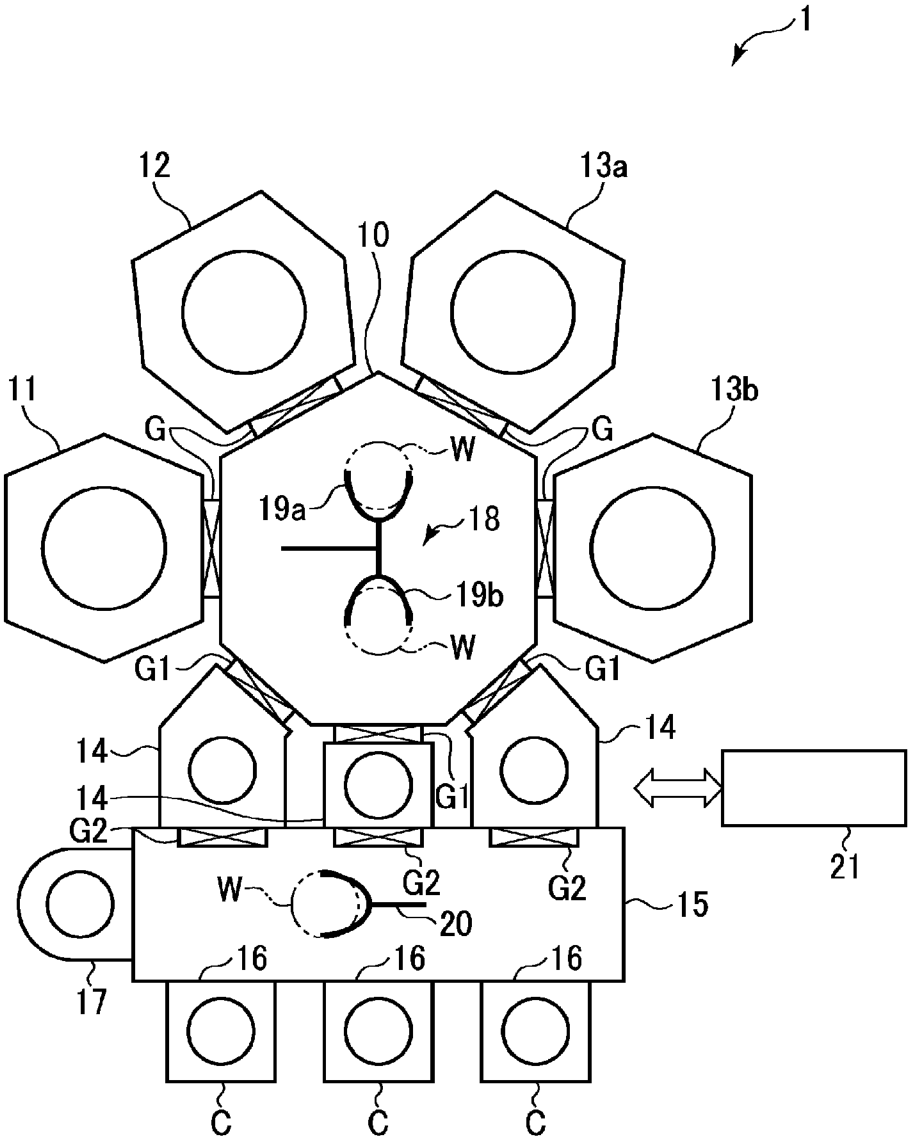
FIG. 1 is a horizontal cross-sectional view schematically illustrating an example of a processing system used for an embedding method according to one embodiment.

First, an example of a processing system used in an embedding method according to one embodiment will be described. FIG. 1 is a horizontal cross-sectional view schematically illustrating such an example of a processing system.

A processing system 1 is for embedding a ruthenium (Ru) film into a recess such as a trench or hole formed in a substrate such as a semiconductor wafer (hereinafter, simply referred to as a wafer) W, and is configured as a cluster tool.

The processing system 1 includes, as main components, four processing apparatuses that perform processings on the wafer W, three load-lock chambers 14, a vacuum transfer chamber 10, an atmospheric transfer chamber 15, and an overall controller 21.

Specifically, the four processing apparatuses include a pre-cleaning apparatus 11, an annealing apparatus 12, a first embedding apparatus 13*a*, and a second embedding apparatus 13*b*. The pre-cleaning apparatus 11 performs a pre-processing such as removing a natural oxide film on a surface of the wafer W. In addition, the annealing apparatus 12 performs annealing after embedding the Ru film. In addition, the first and second embedding apparatuses 13*a* and 13*b* perform embedding the Ru film into the recess by forming the Ru film on the wafer W by CVD. The first embedding apparatus 13*a* performs embedding the Ru film to a middle of the recess at a first temperature, whereas the second embedding apparatus 13*b* performs embedding the Ru film to a remaining portion of the recess at a temperature lower than the first temperature. Details of the embedding apparatuses 13*a* and 13*b* will be described later.

The load-lock chambers 14 are provided between the vacuum transfer chamber 10 and the atmospheric transfer chamber 15, and adjust a pressure between atmospheric pressure and vacuum when transferring the wafer W between the vacuum transfer chamber 10 and the atmospheric transfer chamber 15.

The vacuum transfer chamber 10 is evacuated by a vacuum pump to be maintained at a vacuum level appropriate for an internal pressure of processing containers of the four processing apparatuses, and is provided with a transfer mechanism 18 therein. The vacuum transfer chamber 10 is connected to the four processing apparatuses via gate valves G, and is connected to the three load-lock chambers 14 via gate valves G1.

The transfer mechanism 18 transfers the wafer W with respect to the pre-cleaning apparatus 11, the annealing apparatus 12, the first embedding apparatus 13*a*, the second embedding apparatus 13*b*, and the load-lock chambers 14. The transfer mechanism 18 has two independently movable transfer arms 19*a* and 19*b*.

The atmospheric transfer chamber 15 is maintained at atmospheric atmosphere, and has one wall to which the three load-lock chambers 14 are connected via gate valves G2. The atmospheric transfer chamber 15 has three carrier attachment ports 16, to which carriers (e.g., FOUPs) C accommodating the wafer W are attached, on a wall opposite to the wall where the load-lock chambers 14 are attached. In addition, an alignment chamber 17 for performing alignment of the wafer W is provided on a sidewall of the atmospheric transfer chamber 15. A downflow of clean air is created inside the atmospheric transfer chamber 15.

The atmospheric transfer chamber 15 is provided with a transfer mechanism 20 therein. The transfer mechanism 20 is configured to transfer the wafer W with respect to the carriers C, the load-lock chambers 14, and the alignment chamber 17.

The overall controller 21 controls the entire processing system 1, and transmits control commands to the pre-cleaning apparatus 11, the annealing apparatus 12, the first embedding apparatus 13*a*, and the second embedding apparatus 13*b*. In addition, the overall controller 21 controls exhaust mechanisms and gas supply mechanisms for the vacuum transfer chamber 10 and the load-lock chambers 14, and further controls drive systems for the transfer mechanisms 18 and 20 and the gate valves G, G1 and G2. The overall controller 21 includes a main controller equipped with a CPU (computer) that actually performs controlling the aforementioned components, an input device (a keyboard, a mouse, and the like), an output device (a printer and the like), a display device (a display and the like), and a storage device (storage medium). The main controller causes the processing system 1 to execute a desired processing operation based on a processing recipe stored in the storage medium of the storage device.

Next, outline of an operation of the processing system 1 configured as described above will be described. The following operation is executed based on the processing recipe stored in the storage medium.

First, the transfer mechanism 20 takes out the wafer W from the carrier C connected to the atmospheric transfer chamber 15, and opens the gate valve G2 for one of the load-lock chambers 14 to load the wafer W into that load-lock chamber 14. After the gate valve G2 is closed, an interior of the load-lock chamber 14 is evacuated. Once the load-lock chamber 14 reaches a predetermined vacuum level, the gate valve G1 is opened, and the transfer mechanism 20 removes the wafer W from the load-lock chamber 14.

Thereafter, the removed wafer W is sequentially transferred to the pre-cleaning apparatus 11, the first embedding apparatus 13*a*, the second embedding apparatus 13*b*, and the annealing apparatus 12, and a predetermined processing is performed in each apparatus. When loading and unloading the wafer W with respect to each apparatus, the gate valve G is opened and closed. In addition, the preprocessing by the pre-cleaning apparatus 11 and the annealing by the annealing apparatus 12 are performed as needed.

For the wafer W on which a series of processings has been completed, the gate valve G1 of one of the load-lock chambers 14 is opened, and the transfer mechanism 18 loads the wafer W into that load-lock chamber 14. Thereafter, the interior of the load-lock chamber 14 is returned to atmospheric pressure, the gate valve G2 is opened, and the transfer mechanism 20 returns the wafer W inside the load-lock chamber 14 to the carrier C. The above-described processings are performed concurrently for a plurality of wafers W, so that processings on a predetermined number of wafers W are completed.

The processing system 1 may perform a series of processings on the wafer W without exposing the wafer W to the atmosphere.

<Embedding Apparatus>

Next, an example of the first embedding apparatus 13*a* and the second embedding apparatus 13*b* for performing an embedding process as a main process of the embedding method according to one embodiment will be described. In addition, the first embedding apparatus 13*a* and the second embedding apparatus 13*b* have the same configuration, and thus, only the first embedding apparatus 13*a* will be described below.

Figure 2:
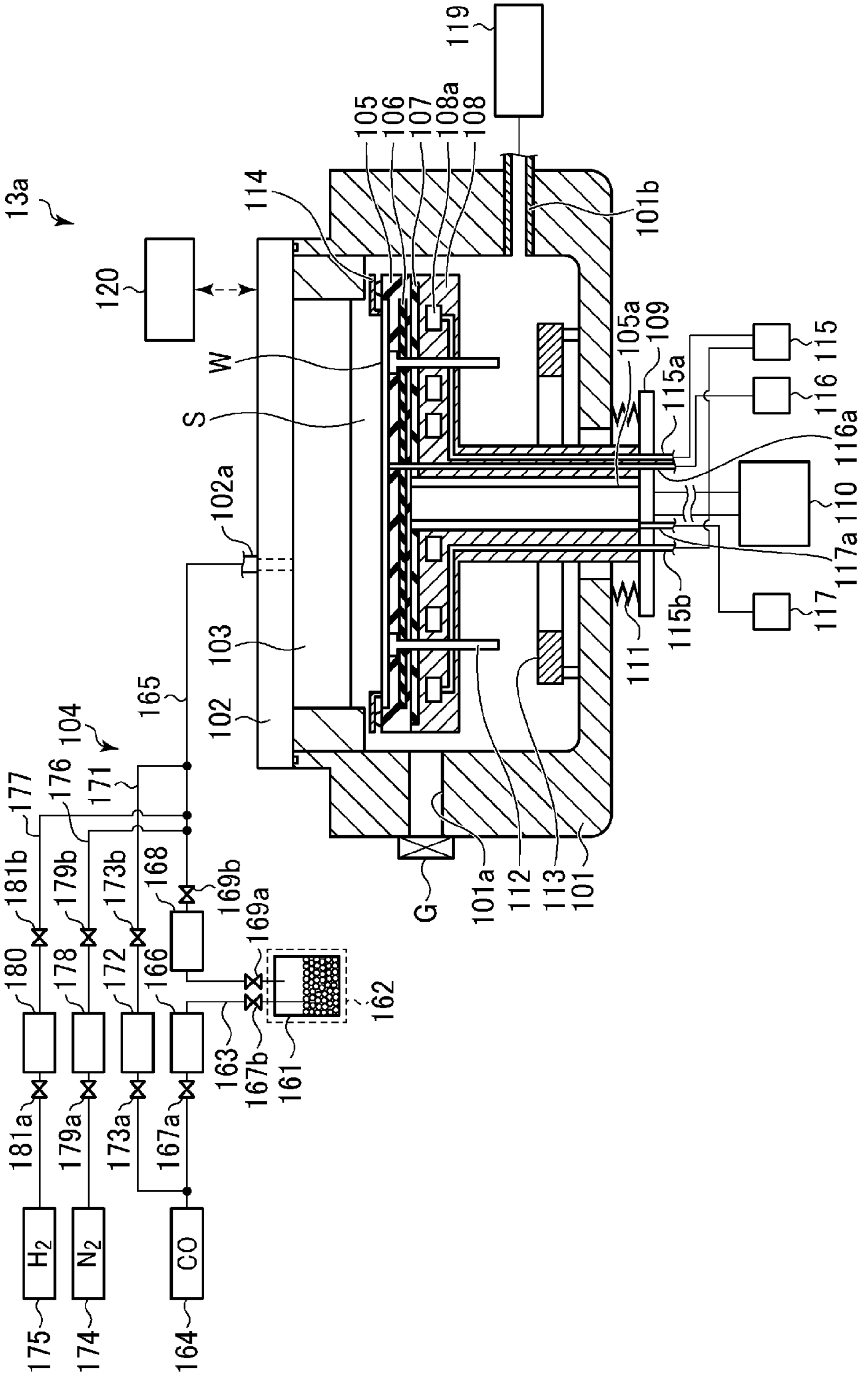
FIG. 2 is a cross-sectional view schematically illustrating a first embedding apparatus for performing an embedding process as a main process of the embedding method according to one embodiment.

FIG. 2 is a cross-sectional view schematically illustrating an example of the first embedding apparatus 13*a*.

As described above, the first embedding apparatus 13*a* performs embedding of the Ru film into the recess by forming the Ru film on the wafer W by CVD.

The first embedding apparatus 13*a* includes a bottomed processing container 101 having an opening at a top thereof. The top opening of the processing container 101 is closed by a support 102 that supports a gas discharge mechanism 103. In addition, when the support 102 closes the top opening of the processing container 101, an interior of the processing container 101 becomes a sealed processing space S.

The gas discharge mechanism 103 discharges, toward the processing space, a gas supplied from a gas supply 104 via a gas supply path 102*a* passing through the support 102.

The gas supply 104 includes a film formation raw material container 161 that accommodates solid ruthenium carbonyl ($Ru_3(CO)_{12}$) as a ruthenium raw material, and sublimates the $Ru_3(CO)_{12}$ to supply it to the gas discharge mechanism 103. A heater 162 is provided around the film formation raw material container 161, and CO gas, which serves as a carrier gas, is blown into the film formation raw material container 161 from a CO gas source 164 via a carrier gas supply pipe 163. In addition, a film formation raw material gas supply pipe 165 is inserted into the film formation raw material container 161, and the film formation raw material gas supply pipe 165 is connected to the gas supply path 102*a*. Thus, the CO gas as the carrier gas is blown into the film formation raw material container 161, and the $Ru_3(CO)_{12}$ gas sublimated in the film formation raw material container 161 is transferred to the film formation raw material gas supply pipe 165 by the CO gas. Then, the $Ru_3(CO)_{12}$ gas reaches the gas discharge mechanism 103 from the film formation raw material gas supply pipe 165 via the gas supply path 102*a*, and is discharged to the processing space S.

The carrier gas supply pipe 163 is provided with a flow rate controller 166 such as a mass flow controller and valves 167*a* and 167*b* located before and after the flow rate controller 166. In addition, the film formation raw material gas supply pipe 165 is provided with a flow meter 168 for measuring an amount of $Ru_3(CO)_{12}$ gas and valves 169*a* and 169*b* located before and after the flow meter 168.

The gas supply 104 further includes a counter CO gas pipe 171 branched from the carrier gas supply pipe 163 at an upstream side of the valve 167*a* the carrier gas supply pipe 163. The counter CO gas pipe 171 is connected to the film formation raw material gas supply pipe 165. Thus, it is possible to supply the CO gas from the CO gas source 164 to the processing space S as a counter gas separately from the $Ru_3(CO)_{12}$ gas. The counter CO gas pipe 171 is provided with a mass flow controller 172 for flow rate control and valves 173*a* and 173*b* located before and after the mass flow controller 172.

In addition, the gas supply 104 further includes a $N_2$ gas source 174 that supplies $N_2$ gas, which serves as a dilution gas, a temperature raising gas, and a purge gas for purging the processing space, and a $H_2$ gas source 175 that supplies $H_2$ gas as a heat transfer gas. A $N_2$ gas supply pipe 176 is connected to the $N_2$ gas source 174, and a $H_2$ gas supply pipe 177 is connected to the $H_2$ gas source 175. The other ends of these pipes are connected to the film formation raw material gas supply pipe 165. The $N_2$ gas supply pipe 176 is provided with a flow rate controller 178 and valves 179*a* and 179*b* located before and after the flow rate controller 178, and the $H_2$ gas supply pipe 177 is provided with a flow rate controller 180 and valves 181*a* and 181*b* located before and after the flow controller 180.

In addition, instead of the $N_2$ gas, other inert gases such as Ar gas may be used as a dilution gas. In addition, instead of the $H_2$ gas, He gas may be used as a heat transfer gas.

A sidewall of the processing container 101 is provided with a loading/unloading port 101*a* for loading and unloading the wafer W and the gate valve G for opening and closing the loading/unloading port 101*a*.

An exhauster 119, which includes a vacuum pump and the like, is connected to a lower sidewall of the processing container 101 via an exhaust pipe 101*b*. The interior of the processing container 101 is evacuated by the exhauster 119 to be set and maintained at a predetermined vacuum atmosphere (e.g., 1.33 Pa).

A stage 105 is a member on which the wafer W is placed. A heater 106 for heating the wafer W is provided in the stage 105. In addition, the stage 105 is supported by a support 105*a*, which extends downward from a center portion of a lower surface of the stage 105 and has one end passing through a bottom of the processing container 101 to be supported by a lifting mechanism via a lifting plate 109. The stage 105 is fixed over a temperature regulating jacket 108, which serves as a temperature regulator, via a heat insulating ring 107. The temperature regulating jacket 108 has a plate for fixing the stage 105, a shaft extending downward from the plate and configured to cover the support 105*a*, and a hole formed through the shaft and the plate.

The shaft of the temperature regulating jacket 108 passes through the bottom of the processing container 101. A lower end of the shaft of the temperature regulating jacket 108 is supported by the lifting plate 109 disposed below the processing container 101. The lifting mechanism 110 is provided below the lifting plate 109, and the stage 105 can be moved vertically by the lifting mechanism 110 via the lifting plate 109 and the temperature regulating jacket 108. The lifting mechanism 110 moves the stage 105 vertically between a processing position illustrated in FIG. 2 where the wafer W is processed and a transfer position (not illustrated) where the wafer W is transferred via the loading/unloading port 101*a*. A bellows 111 is provided between the bottom of the processing container 101 and the lifting plate 109 to maintain airtightness inside the processing container 101 even when the lifting plate 109 moves up and down.

Lifting pins 112 are inserted through the stage 105 and the plate of the temperature regulating jacket 108. Each of the lifting pins 112 has a shaft portion and a head portion having a larger diameter than the shaft portion. The shaft portion is inserted through insertion through-holes formed in the stage 105 and the plate of the temperature regulating jacket 108. A groove for accommodating the head portion having a larger diameter than the through-hole is formed in a placement surface of the stage 105 at a position corresponding to the through-hole.

The lifting pins 112 are provided so as to be movable vertically. When the stage 105 is at the processing position, as illustrated in FIG. 2, the head portion is accommodated in the groove and is engaged by a bottom surface of the groove, a lower end of the shaft portion protrudes downward from the plate of the temperature regulating jacket 108, and the wafer W is placed on the placement surface of the stage 105.

Once the stage 105 is lowered to the transfer position of the wafer W, the lower end of the lifting pin 112 is brought into contact with an abutter 113, and by further lowering the stage 105, the head portion of the lifting pin 112 protrudes from the placement surface of the stage 105. Thus, the wafer W can be raised from the placement surface of the stage 105 in a state in which the head portion of the lifting pin 112 supports a lower surface of the wafer W.

An annular member 114 is arranged at a position corresponding to an outer periphery of the wafer W above the stage 105. As illustrated in FIG. 2, when the stage 105 is at the processing position, the annular member 114 is in contact the outer periphery of an upper surface of the wafer W and the wafer W is pressed against the placement surface of the stage 105 by a weight of the annular member 114 itself. On the other hand, when the stage 105 is moved to the transfer position of the wafer W, the annular member 114 is engaged by a stopper (not illustrated) at a position above the loading/unloading port 101*a*. Thus, the annular member 114 is prevented from hindering the transfer of the wafer W.

A chiller unit 115, a heat transfer gas supply 116, and a purge gas supply 117 are provided below the processing container 101.

The chiller unit 115 circulates a coolant, for example, cooling water, in a flow path 108*a* formed in the plate of the temperature regulating jacket 108 via pipes 115*a* and 115*b*.

The heat transfer gas supply 116 supplies a heat transfer gas such as He gas between a rear surface of the wafer W and the placement surface of the stage 105 via a pipe 116*a*.

The purge gas supply 117 flows CO gas as a purge gas to a pipe 117*a*, a gap formed between the support 105*a* and the hole of the temperature regulating jacket 108, a flow path (not illustrated) formed between the stage 105 and the heat insulating ring 107 and extending radially outward, and a vertical flow path (not illustrated) formed at the outer periphery of the stage 105. The CO gas as a purge gas is supplied to a space between a lower surface of the annular member 114 and an upper surface of the stage 105. Thus, a processing gas is prevented from flowing into the space between the lower surface of the annular member 114 and the upper surface of the stage 105, and film formation on the lower surface of the annular member 114 or the upper surface of the outer periphery of the stage 105 is prevented.

A control device 120 controls, based on the commands from the overall controller 21, respective components of the first embedding apparatus 13*a*, such as the gas supply 104, the heater 106, the lifting mechanism 110, the chiller unit 115, the heat transfer gas supply 116, the purge gas supply 117, the gate valve G, and the exhauster 119. In addition, the first embedding apparatus 13*a* may be controlled by the overall controller 21, and in that case, the control device 120 is not necessary.

An operation of the first embedding apparatus 13*a* configured as described above will be described. The following operation is executed under a control of the control device 120.

First, the processing space S in the processing container 101 is set to be a vacuum atmosphere, and while the stage 105 is located at the transfer position, the gate valve G is opened and the wafer W is loaded by the transfer mechanism 18. Then, the wafer W is placed on the lifting pins 112 protruding from the stage 105. After the transfer mechanism 18 is retracted from the inside of the processing container 101, the gate valve G is closed.

Subsequently, the stage 105 is moved to the processing position. At this time, as the stage 105 is raised, the wafer W placed on the lifting pins 112 is placed on the placement surface of the stage 105. In addition, the annular member 114 is brought into contact with the outer periphery of the upper surface of the wafer W, and the wafer W is pressed against the placement surface of the stage 105 by the weight of the annular member 114 itself.

In this state, an internal pressure of the processing space S is regulated, and the wafer W is heated to be a set temperature by the heater 106 via the stage 105. In addition, the gas supply 104 supplies $Ru_3(CO)_{12}$ gas as a ruthenium-containing gas, together with CO gas as the carrier gas, to the processing space S from the gas discharge mechanism 103. Thus, a Ru film is embedded in the recess formed in the wafer W. A remaining gas after the process described above passes through a flow path on a side of an upper surface of the annular member 114 and is discharged by the exhauster 119 via the exhaust pipe 101*b*.

In addition, other gases such as the counter CO gas different from the carrier gas, $N_2$ gas as a dilution gas, and $H_2$ gas as a heat transfer gas may be supplied.

In the embedding process, the heat transfer gas is supplied to a space between the rear surface of the wafer W and the placement surface of the stage 105. In addition, the CO gas is supplied as a purge gas from the purge gas supply 117 to the space between the lower surface of the annular member 114 and the upper surface of the stage 105. Thus, the processing gas is prevented from flowing into the space between the lower surface of the annular member 114 and the stage 105, and film formation on the lower surface of the annular member 114 or the upper surface of the outer periphery of the stage 105 is prevented. The purge gas passes through a flow path on a side of the lower surface of the annular member 114 and is discharged by the exhauster 119.

Once the embedding process is completed, the stage 105 is moved (lowered) to the transfer position that corresponds to the loading/unloading port 101*a*. At this time, the lower ends of the lifting pins 112 are brought into contact with the abutter 113, so that the lifting pins 112 protrude from the placement surface of the stage 105 and raises the wafer W from the placement surface of the stage 105. Thereafter, the gate valve G is opened, and the wafer W placed on the lifting pins 112 is unloaded by the transfer mechanism 18.

Embedding Method According to One Embodiment

Next, the embedding method according to one embodiment will be described.

In the present embodiment, the Ru film is embedded into the recess formed in the wafer W. The embedding the Ru film is performed by the processing system described with reference to FIG. 1.

Figure 3:
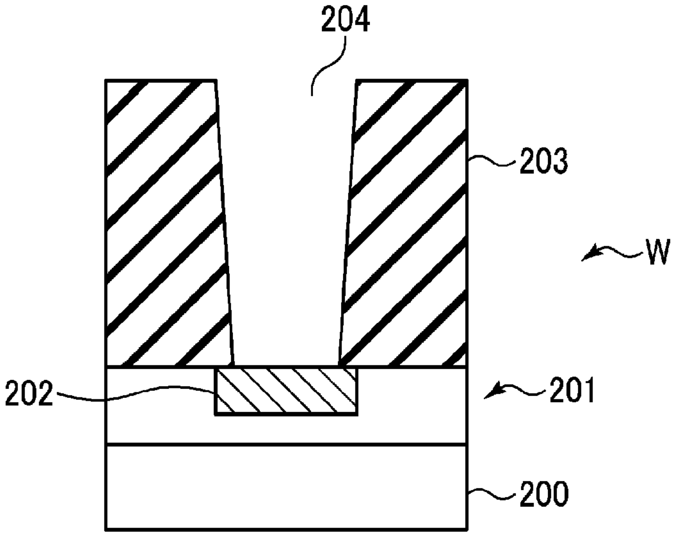
FIG. 3 is a cross-sectional view schematically illustrating a structure of a wafer used in the embedding method according to one embodiment.

FIG. 3 is a cross-sectional view schematically illustrating a structure of the wafer W used in the embedding method according to the present embodiment. The wafer W includes a silicon base body 200, a lower structure 201 provided on the silicon main body 200 and having a metal film 202, and an insulating film 203 provided on the lower structure 201 and having a recess 204. The metal film 202 is exposed from a bottom of the recess 204.

The lower structure 201 is configured, for example, such that the metal film 202 is formed in an insulating film. The metal film 202 may be made of a material that is less likely to react with the Ru film to be embedded, and examples thereof include a tungsten (W) film, a cobalt (Co) film, and a titanium (Ti) film. Examples of the insulating film 203 include Si-containing films such as a $SiO_2$ film, a SiN film, and a low-k film. The insulating film 203 may have a stacked structure of different types of films, for example, a stacked structure of a SiN film and a $SiO_2$ film. Examples of the recess 204 include trenches or holes (vias, contact holes, and the like).

Figure 4A:
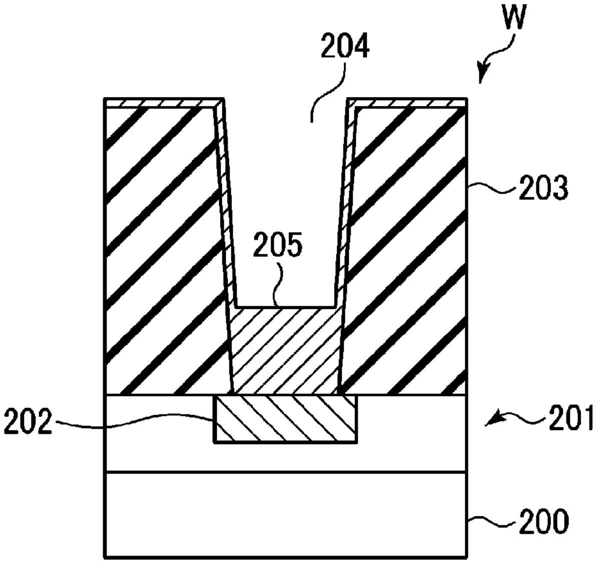
FIGS. 4A and 4B are cross-sectional views illustrating a process of embedding a Ru film by the embedding method according to one embodiment.
Figure 4B:
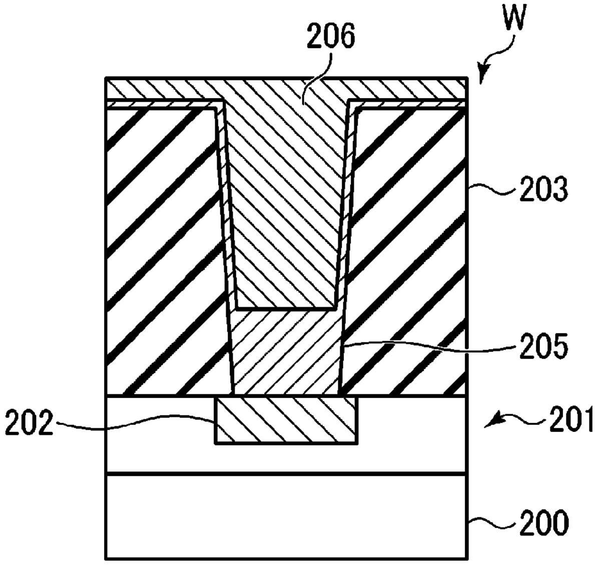

With respect to the wafer W described above, the Ru film is formed by CVD so that the Ru film is embedded into the recess 204. FIGS. 4A and 4B are cross-sectional views illustrating a process of embedding the Ru film. When embedding the Ru film, first, a first embedding process of embedding a first Ru film 205 up to a middle of the recess 204 is performed by the first embedding apparatus 13*a*, as illustrated in FIG. 4A. Subsequently, the wafer W is transferred to the second embedding apparatus 13*b*, and a second embedding process of embedding a second Ru film 206 to the remaining portion of the recess 204 is performed, as illustrated in FIG. 4B. At this time, the first embedding process is performed at a first temperature, and the second embedding process is performed at a second temperature lower than the first temperature.

Figure 5A:
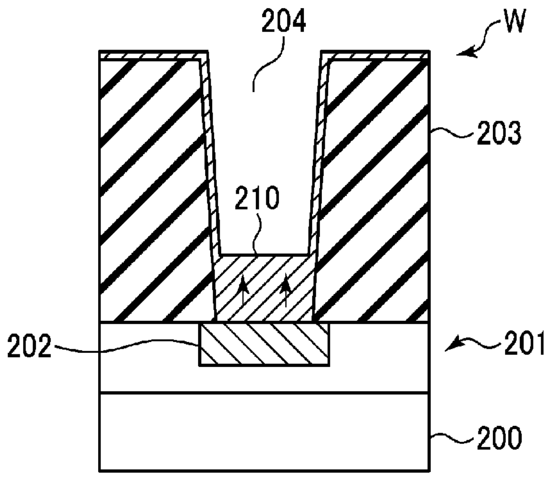
FIGS. 5A to 5C are cross-sectional views illustrating bottom-up film formation.
Figure 5B:
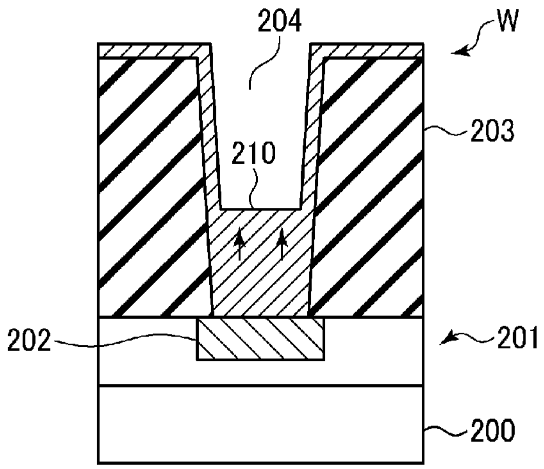
Figure 5C:
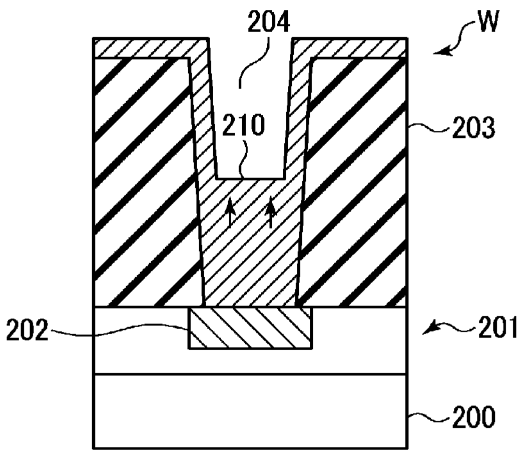

Formation of a Ru film by CVD exhibits selectivity where, at a film formation temperature higher than a certain threshold, the Ru film is easily formed on metals, whereas it is difficult to form the Ru film on insulators. Thus, when embedding the Ru film into the wafer W having the structure illustrated in FIG. 3 at a high temperature exhibiting the selectivity as described above, the Ru film is easily formed on the metal film 202 exposed at the bottom of the recess 204, whereas it is difficult to form the Ru film on the insulating film 203. Therefore, in general, a Ru film 210 is embedded into the recess 204 with good embeddability by bottom-up film formation in which film formation progresses from the bottom, as illustrated in FIGS. 5A to 5C. The aforementioned Patent Document 2 utilizes such bottom-up film formation.

Figure 6A:
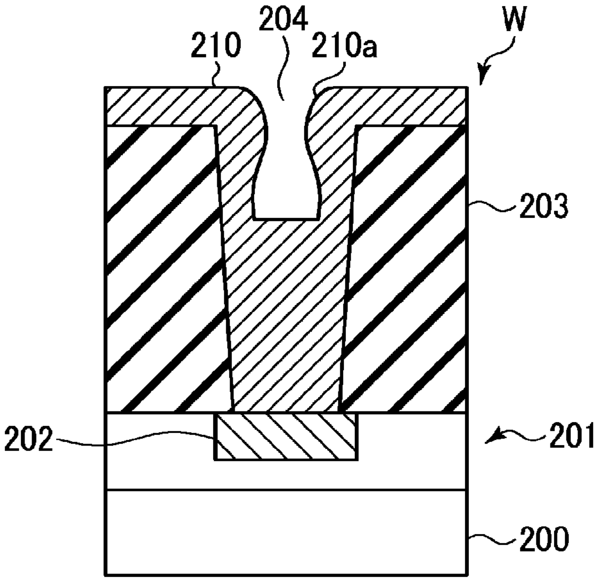
FIGS. 6A and 6B are cross-sectional views illustrating a state in which embeddability deteriorates due to bottom-up film formation.
Figure 6B:
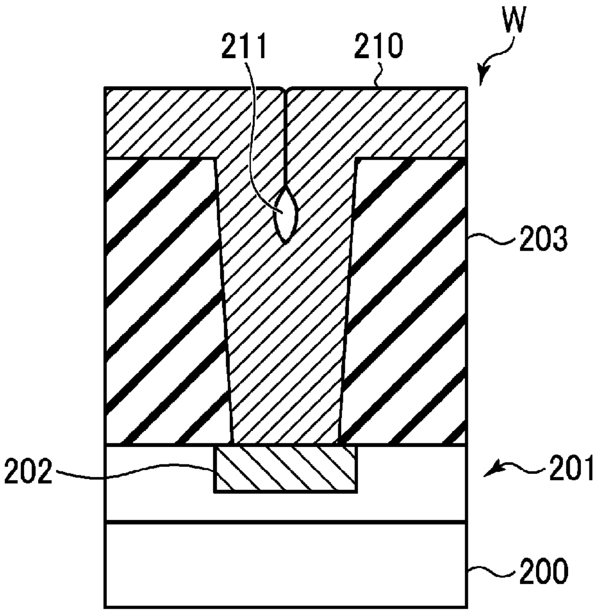

However, in the bottom-up film formation, smoothness (flatness) of a sidewall during embedding the Ru film may not be sufficient, and thus, as illustrated in FIG. 6A, an overhang 210*a* of the Ru film 210 may be generated in an opening of the recess 204. Recently, miniaturization of recesses such as trenches or holes in semiconductor devices are being progressed. Thus, even when a slight overhang is generated, the embeddability may decrease as the film formation further progresses, for example, void 211 may remain in the film as illustrated in FIG. 6B.

Figure 7A:
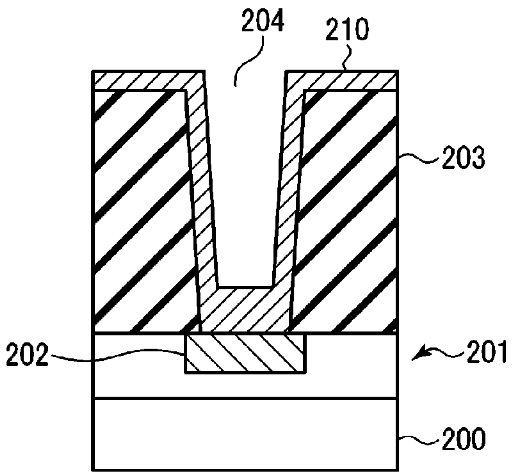
FIGS. 7A to 7C are cross-sectional views illustrating conformal film formation.
Figure 7B:
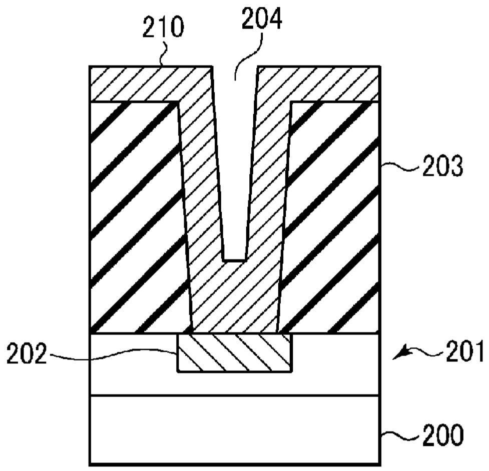
Figure 7C:
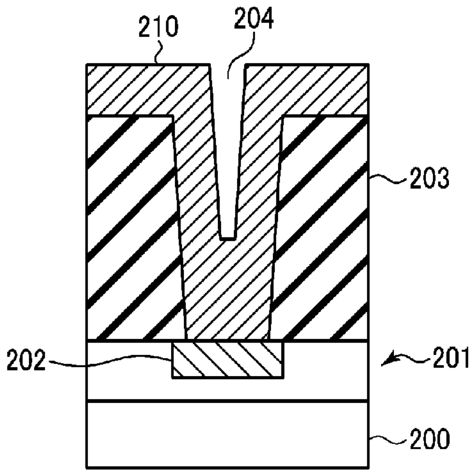
Figure 8A:
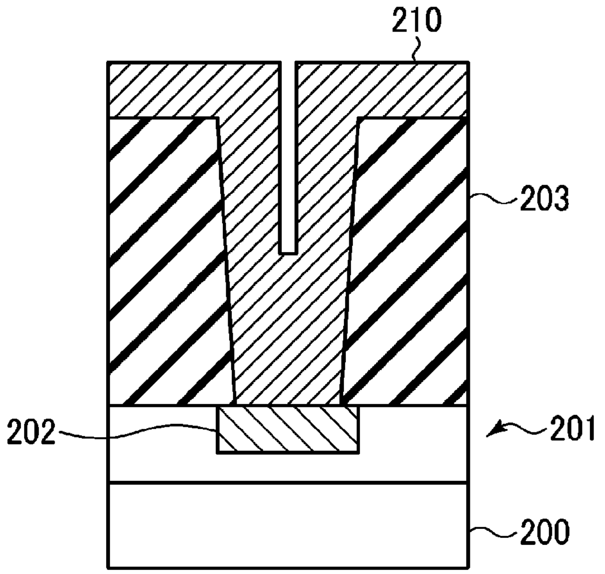
FIGS. 8A and 8B are cross-sectional views illustrating a state in which embeddability deteriorates due to conformal film formation.
Figure 8B:
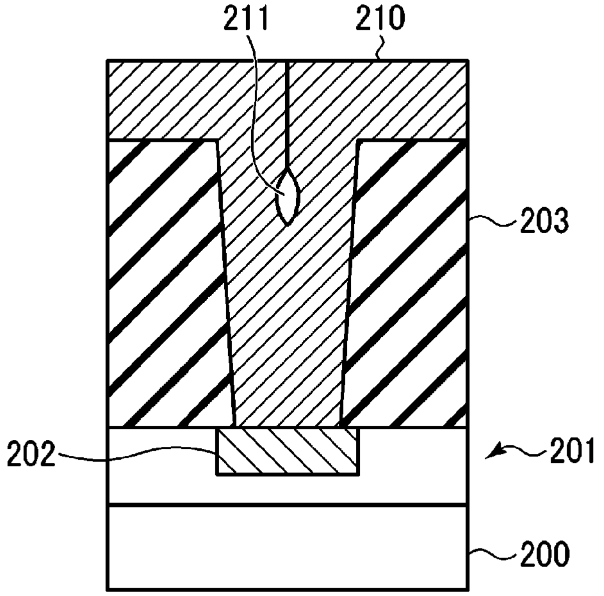

On the other hand, the selectivity as described above decreases at a low film formation temperature, and in general, the Ru film 210 is formed conformally in the recess 204 with a consistent film thickness on both the metal film 202 at the bottom and the insulating film 203 at the sidewall, as illustrated in FIGS. 7A to 7C. In the conformal film formation, since the smoothness (flatness) of the sidewall is good, overhangs are hardly generated. However, as the film formation progresses, as illustrated in FIG. 8A, the opening of the recess 204 becomes narrower, and eventually, as illustrated in FIG. 8B, the void 211 easily remains, resulting in inherently poor embeddability.

Therefore, in the present embodiment, the first embedding process is first performed up to a middle of the recess 204 by the first embedding apparatus 13*a*, which is set to be a high temperature, and then, the second embedding process is performed by the second embedding apparatus 13*b*, which is set to be a low temperature. At this time, a timing of switching from the first embedding process to the second embedding process may be appropriately set within a range that does not generate an overhang of the recess 204.

With this configuration, it is possible to embed the first Ru film 205 with good embeddability by the bottom-up film formation in the first embedding process, and to embed the second Ru film 206 with good smoothness (flatness) by the conformal film formation in the second embedding process. In addition, in the second embedding process, the conformal film formation does not damage the embeddability because the first Ru film 205 is already embedded in the recess 204. Therefore, it is possible to embed the Ru film into the recess 204 with good embeddability.

In addition, since the first embedding process is performed using the first embedding apparatus 13*a* which is set in advance to a high temperature and the second embedding process is performed using the second embedding apparatus 13*b* which is set in advance to a low temperature, high throughput can be achieved.

When a pressure (internal pressure of the processing space S) during the first embedding process is a first pressure and a pressure during the second embedding process is a second pressure, the first pressure may be set to be lower than the second pressure. By setting the pressure relatively low during the first embedding process, the progress of bottom-up film formation is facilitated, and by setting the pressure relatively high during the second embedding process, the progress of conformal film formation is facilitated.

In addition, a flow rate of the $Ru_3(CO)_{12}$ gas (i.e., a flow rate of CO gas as the carrier gas) during the second embedding process may be smaller than that during the first embedding process. This facilitates changing a Ru film raw material from $Ru_3(CO)_{12}$ to $Ru(CO)_4$, which is easily adsorbed to a bottom of the recess such as a via. With this configuration, it is considered that the bottom-up film formation is facilitated.

In the above, two-step film formation, in which the second embedding process is performed after the first embedding process is performed, has been described. However, it is also possible to perform a second round of the first embedding process after performing the first embedding process and the second embedding process. In this case, after performing the second embedding process using the second embedding apparatus 13*b*, the wafer W may be returned to the first embedding apparatus 13*a* to perform the second round of the first embedding process. Alternatively, another first embedding apparatus may be provided to perform the second round of the first embedding process. In addition, the first embedding process and the second embedding process may be repeated.

Next, the first embedding process and the second embedding process will be described in detail.

The first temperature during the first embedding process may be between 150 degrees C. and 190 degrees C. If the first temperature is lower than 150 degrees C., it may lead to a decrease in selectivity of the Ru film formation on the metal film (W film) 202 and the insulating film ($SiO_2$ film) 203, thereby making it difficult to perform the bottom-up film formation. On the other hand, if the first temperature is higher than 190 degrees C., it may result in deterioration of film quality. In addition, the first pressure during the first embedding process may be between 0.6 Pa and 2.2 Pa. This pressure range facilitates changing a Ru film raw material from $Ru_3(CO)_{12}$ to $Ru(CO)_4$, which is easily adsorbed to the bottom of the recess such as a via. With this configuration, it is considered that the bottom-up film formation is facilitated.

In addition, the second temperature during the second embedding process may be between 100 degrees C. and 140 degrees C. If the second temperature is lower than 100 degrees C., it tends to impede progress of the film formation, whereas if the second temperature is higher than 140 degrees C., it may result in a decrease in smoothness (flatness). In addition, the second pressure during the second embedding process may be between 13.3 Pa and 20 Pa. Within this range, desired conformal film formation can progress.

In addition, the flow rate of CO gas as the carrier gas for transferring the $Ru_3(CO)_{12}$ gas may be between 100 sccm and 500 sccm during the first embedding process, and may be between 10 sccm and 90 sccm in the second embedding process. Within these ranges, it is considered that changing a Ru film raw material from $Ru_3(CO)_{12}$ to $Ru(CO)_4$, which is easily adsorbed to the bottom of the recess such as a via, is facilitated, thereby facilitating the bottom-up film formation.

Use of the CO gas as the carrier gas is to minimize occurrence of a decomposition reaction, which occurs when forming the Ru film using the $Ru_3(CO)_{12}$ gas and is represented by the following Equation (1), on the surface of the wafer W until the gas reaches the wafer W.

$$Ru_3(CO)_{12} \rightarrow 3Ru+12CO \quad (1)$$

In addition, in order to more effectively suppress the decomposition reaction of the $Ru_3(CO)_{12}$ gas, it is effective to reduce a partial pressure ratio of $Ru_3(CO)_{12}/CO$. Therefore, the CO gas is supplied to the processing space S as a counter gas in addition to the carrier gas. A flow rate of CO gas supplied as the counter gas may be between 50 sccm and 100 sccm in both the first embedding process and the second embedding process.

In addition, by using the CO gas also as a purge gas, it is possible to improve the effect of preventing the processing gas from flowing into the space between the lower surface of the annular member 114 and the upper surface of the stage 105. A flow rate of CO gas supplied as a purge gas may be between 50 sccm and 100 sccm in both the first embedding process and the second embedding process.

In addition, when supplying the $Ru_3(CO)_{12}$ gas, an appropriate amount of $N_2$ gas as a dilution gas may be supplied as needed. In addition, before supplying the $Ru_3(CO)_{12}$ gas, $H_2$ gas as a heat transfer gas may be supplied to the processing space S. At this time, the $N_2$ gas may be supplied together with the $H_2$ gas. In addition, other inert gases such as Ar gas may be used as the dilution gas, instead of the $N_2$ gas. In addition, He gas may be used as a heat transfer gas, instead of the $H_2$ gas.

In the first embedding process and the second embedding process, the step of supplying the $Ru_3(CO)_{12}$ gas to form a film and a step of purging the processing space S with the $N_2$ gas may be alternately repeated. With this configuration, it is possible to appropriately discharge the CO gas generated by the decomposition of the $Ru_3(CO)_{12}$ gas, and to embed a high-quality Ru film. Other inert gases such as Ar gas may be used as the purge gas.

In the present embodiment, prior to the process of embedding the Ru film as described above, a pre-cleaning process of removing a natural oxide film on the surface of the metal film 202 may be performed by the pre-cleaning apparatus 11 as needed. By removing the natural oxide film, it is possible to improve the film quality of the embedded Ru film. The pre-cleaning process may be implemented by, for example, a $H_2$ plasma processing, an Ar plasma processing, or both of the $H_2$ plasma processing and the Ar plasma processing.

In addition, after the process of embedding the Ru film, for the purpose of improving crystallinity or adhesion, an annealing process may be performed by the annealing apparatus 12 as needed.

Experimental Example

Next, an experimental example will be described.

Figure 9:
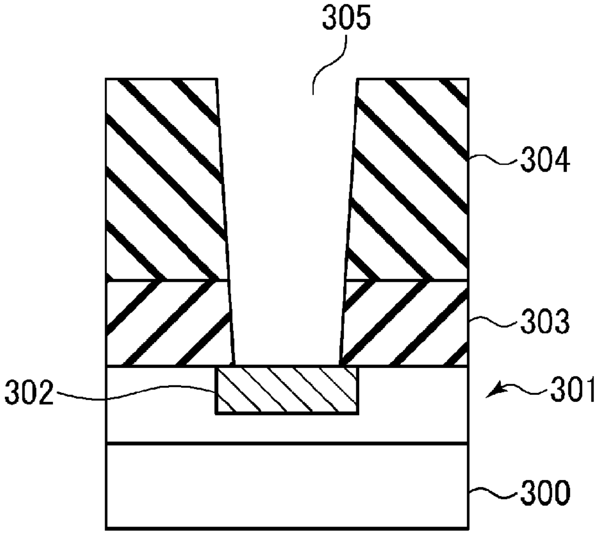
FIG. 9 is a cross-sectional view illustrating a structure of a wafer used in an experimental example.

Here, as illustrated in FIG. 9, a wafer, which includes a silicon base body 300, a lower structure 301 having a W film 302 provided on the silicon base body 300, a SiN film 303 provided on the lower structure 301, and a $SiO_2$ film 304 provided on the SiN film 303, was used. The used wafer has a structure in that a plurality of vias 305, each having a diameter of 15 nm and a depth of 60 nm, were formed in the SiN film 303 and the $SiO_2$ film 304, and the W film was exposed from a bottom of the via 305.

With respect to the wafer described above, an embedding process using the processing system illustrated in FIG. 1 was performed. Initially, an $H_2$ plasma processing and an Ar plasma processing were performed by the pre-cleaning apparatus 11 to remove a natural oxide film on a surface of the tungsten film.

Thereafter, a Ru film was embedded into the vias in Case 1 and Case 2 to be described below.

In Case 1, the Ru film was embedded using the first embedding apparatus 13*a* under the following Condition A (high temperature and low pressure condition) only. For the embedding at this time, the number of cycles of embedding and purging was set in advance through film formation experiments using blank wafers to achieve a film thickness of 3.5 nm.

Condition A

Temperature: 155 degrees C.
Pressure: 2.2 Pa (16.6 mTorr)
Carrier CO gas flow rate: 100 sccm
Counter CO gas flow rate: 50 sccm
Purge CO gas flow rate: 100 sccm In Case 2, after the first embedding process was performed using the first embedding apparatus 13*a* under the above Condition A (high temperature and low pressure condition), the wafer was transferred to the second embedding apparatus 13*b*, and the second embedding process was performed under the following Condition B (low temperature and high pressure condition). For the embedding at this time, the number of cycles of embedding and purging was set in advance through film formation experiments using blank wafers to achieve a film thickness of 1.0 nm in the first embedding process and a film thickness of 24 nm in the second embedding process.

Condition B

Temperature: 135 degrees C.
Pressure: 13.3 Pa (100 mTorr)
Carrier CO gas flow rate: 75 sccm
Counter CO gas flow rate: 50 sccm
Purge CO gas flow rate: 100 sccm After performing the embedding in Case 1 and Case 2, the embedding states of twelve vias in each case was observed by electron microscopy. The observation result showed that a ratio of vias embedded without voids was 42% in Case 1 and 50% in Case 2. In Case 1, only bottom-up film formation was performed, and in Case 2, conformal film formation was performed after bottom-up film formation. Superiority of two-step embedding in the embodiment was confirmed.

<Other Applications>

Although the embodiment has been described above, the embodiment disclosed herein should be considered to be exemplary and not restrictive in all respects. The above embodiment may be omitted, replaced, or modified in various ways without departing from the scope and spirit of the appended claims.

For example, in the above embodiment, the example of using $Ru_3(CO)_{12}$ gas as the Ru film raw material has been described, but the present disclosure is not limited thereto. For example, other gases containing $Ru_3(CO)_{12}$ (without containing oxygen gas), such as (2,4-dimethylpentadienyl)(ethylcyclopentadienyl)ruthenium:(Ru(DMPD)(EtCp)), bis(2,4-dimethylpentadienyl)ruthenium:($Ru(DMPD)_2$), (2,4-dimethylpentadienyl)(methylcyclopentadienyl)ruthenium:(Ru(DMPD)(MeCp)), bis(cyclopentadienyl)ruthenium:($Ru(C_5H_5)_2$), cis-dicarbonyl bis(5-methylhexane-2,4-diionate) ruthenium (II), and bis(ethylcyclopentadienyl)ruthenium (II):$Ru(EtCp)_2$ may also be used.

In addition, the processing system of FIG. 1 is merely given by way of example, and the present disclosure is not limited thereto. For example, the number of vacuum transfer chambers or load-lock chambers, and the number of processing apparatuses connected to the vacuum transfer chamber are arbitrary. In the above embodiment, the processing system equipped with the pre-cleaning apparatus and the annealing apparatus has been described, but the pre-cleaning apparatus and the annealing apparatus may be omitted. In addition, the number of first and second embedding apparatuses is arbitrary as long as at least one of each is included. The embedding apparatus illustrated in FIG. 2 is merely given by way of example, and the present disclosure is not limited thereto.

In addition, in the above embodiment, the semiconductor wafer has been described as an example of a substrate. However, the present disclosure is not limited to the semiconductor wafer, and the substrate may be other types of substrates such as glass substrates used in flat panel displays (FPDs) and ceramic substrates.

EXPLANATION OF REFERENCE NUMERALS

1: processing system, 10: vacuum transfer chamber, 11: pre-cleaning apparatus, 13*a*: first embedding apparatus, 13*b*: second embedding apparatus, 14: load-lock chamber, 15: atmospheric transfer chamber, 18, 20: transfer mechanism, 21: overall controller, 101: processing container, 104: gas supply, 105: stage, 106: heater, 120: control device, 200: silicon base body, 201: lower structure, 202: metal film, 203: insulating film, 204: recess, 205: first Ru film, 206: second Ru film, 210: Ru film, S: processing space, W: wafer

What is claimed is:

1. An embedding method comprising:

preparing a substrate including an insulating film formed with a recess and a metal film exposed from a bottom of the recess;

embedding a first ruthenium film from the bottom of the recess to a middle of the recess by CVD using a ruthenium-containing gas while heating the substrate to a first temperature; and embedding a second ruthenium film over the first ruthenium film in the recess by CVD using the ruthenium-containing gas while heating the substrate to a second temperature lower than the first temperature, wherein a pressure during the embedding the first ruthenium film is set to be a first pressure, and a pressure during the embedding the second ruthenium film is set to be a second pressure higher than the first pressure.

2. The embedding method of claim 1, wherein during the embedding the first ruthenium film, the first ruthenium film is embedded in the recess in a bottom-up manner from the metal film at the bottom, and during the embedding the second ruthenium film, the second ruthenium film is conformally embedded in the recess.

3. An embedding method comprising:

preparing a substrate including an insulating film formed with a recess and a metal film exposed from a bottom of the recess;

embedding a first ruthenium film from the bottom of the recess to a middle of the recess by CVD using a ruthenium-containing gas while heating the substrate to a first temperature; and embedding a second ruthenium film over the first ruthenium film in the recess by CVD using the ruthenium-containing gas while heating the substrate to a second temperature lower than the first temperature, wherein the embedding method uses a processing system including a first embedding apparatus that performs the embedding the first ruthenium film at the first temperature and a second embedding apparatus that performs the embedding the second ruthenium film at the second temperature, and wherein the substrate is transferred to the first embedding apparatus to be subjected to the embedding the first ruthenium film, and subsequently, the substrate is transferred to the second embedding apparatus to be subjected to the embedding the second ruthenium film.

4. The embedding method of claim 1, wherein the ruthenium-containing gas used when embedding the first ruthenium film and the second ruthenium film is ruthenium carbonyl gas.

5. The embedding method of claim 4, wherein the first temperature is between 150 degrees C. and 190 degrees C., and the second temperature is between 100 degrees C. and 140 degrees C.

6. An embedding method comprising:

preparing a substrate including an insulating film formed with a recess and a metal film exposed from a bottom of the recess;

embedding a first ruthenium film from the bottom of the recess to a middle of the recess by CVD using a ruthenium-containing gas while heating the substrate to a first temperature; and embedding a second ruthenium film over the first ruthenium film in the recess by CVD using the ruthenium-containing gas while heating the substrate to a second temperature lower than the first temperature, wherein the ruthenium-containing gas used when embedding the first ruthenium film and the second ruthenium film is ruthenium carbonyl gas, and wherein a pressure during the embedding the first ruthenium film is between 0.6 Pa and 2.2 Pa, and a pressure during the embedding the second ruthenium film is between 13.3 Pa to 20 Pa.

7. An embedding method comprising:

preparing a substrate including an insulating film formed with a recess and a metal film exposed from a bottom of the recess;

embedding a first ruthenium film from the bottom of the recess to a middle of the recess by CVD using a ruthenium-containing gas while heating the substrate to a first temperature; and embedding a second ruthenium film over the first ruthenium film in the recess by CVD using the ruthenium-containing gas while heating the substrate to a second temperature lower than the first temperature, wherein the ruthenium-containing gas used when embedding the first ruthenium film and the second ruthenium film is ruthenium carbonyl gas, and wherein the ruthenium carbonyl gas is supplied by sublimating solid ruthenium carbonyl and using CO gas as a carrier gas, and wherein a flow rate of the carrier gas during the embedding the first ruthenium film is between 100 sccm and 500 sccm, and a flow rate of the carrier gas during the embedding the second ruthenium film is between 10 sccm and 90 sccm.

8. The embedding method of claim 1, wherein after the embedding the second ruthenium film, the embedding the first ruthenium film is further performed.

9. The embedding method of claim 1, wherein, after the embedding the second ruthenium film, the embedding the first ruthenium film and the embedding the second ruthenium film are performed once or a plurality of times.

10. The embedding method of claim 1, further comprising removing a natural oxide film formed on a surface of the metal film before the embedding the first ruthenium film.

11. The embedding method of claim 1, wherein the insulating film is a Si-containing film.

12. The embedding method of claim 1, wherein the metal film is one of a tungsten film, a cobalt film, and a titanium film.

13. A processing system for embedding a ruthenium film in a recess of a substrate, the substrate including an insulating film formed with the recess and a metal film exposed from a bottom of the recess, the processing system comprising:

a first embedding apparatus that performs embedment in the recess by CVD using a ruthenium-containing gas;

a second embedding apparatus that performs embedment in the recess by CVD using the ruthenium-containing gas;

a vacuum transfer chamber connected to the first embedding apparatus and the second embedding apparatus, wherein a transfer mechanism that transfers the substrate is provided inside the vacuum transfer chamber; and a controller, wherein the controller controls the first embedding apparatus, the second embedding apparatus, and the transfer mechanism to execute:

transferring the substrate to the first embedding apparatus, and embedding, by the first embedding apparatus, a first ruthenium film from the bottom of the recess to a middle of the recess while heating the substrate to a first temperature; and then transferring the substrate to the second embedding apparatus, and embedding, by the second embedding apparatus, a second ruthenium film over the first ruthenium film in the recess while heating the substrate to a second temperature lower than the first temperature.

14. The processing system of claim 13, wherein the controller sets a pressure during the embedding by the first embedding apparatus to be a first pressure, and sets a pressure during the embedding by the second embedding apparatus to be a second pressure higher than the first pressure.

15. The processing system of claim 13, wherein the first embedding apparatus and the second embedding apparatus use ruthenium carbonyl gas as the ruthenium-containing gas.

16. The processing system of claim 15, wherein the controller controls the first embedding apparatus and the second embedding apparatus to set the first temperature to be between 150 degrees C. and 190 degrees C. and set the second temperature to be between 100 degrees C. and 140 degrees C.

17. The processing system of claim 15, wherein the controller controls the first embedding apparatus and the second embedding apparatus to set a pressure during the embedding by the first embedding apparatus to be between 0.6 Pa and 2.2 Pa and set a pressure during the embedding by the second embedding apparatus to be between 13.3 Pa and 20 Pa.

18. The processing system of claim 13, further comprising a preprocessing apparatus connected to the vacuum transfer chamber, wherein the controller controls the preprocessing apparatus to remove a natural oxide film formed on a surface of the metal film before embedding the ruthenium film.

* * * * *